(12) United States Patent
He et al.

(10) Patent No.: US 6,795,342 B1
(45) Date of Patent: Sep. 21, 2004

(54) SYSTEM FOR PROGRAMMING A NON-VOLATILE MEMORY CELL

(75) Inventors: Yi He, Fremont, CA (US); Zhizheng Liu, Sunnyvale, CA (US); Mark W. Randolph, San Jose, CA (US); Sameer S. Haddad, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 4 days.

(21) Appl. No.: 10/307,667

(22) Filed: Dec. 2, 2002

(51) Int. Cl.[7] .............................................. G11C 16/04
(52) U.S. Cl. .............................. 365/185.16; 365/185.18
(58) Field of Search ....................... 365/185.16, 185.18, 365/185.29

(56) References Cited

U.S. PATENT DOCUMENTS 6,525,969 B1 * 2/2003 Kurihara et al. ....... 365/185.25
6,639,844 B1 * 10/2003 Liu et al. ................. 365/185.3
6,657,894 B2 * 12/2003 Yeh et al. .............. 365/185.16

* cited by examiner

Primary Examiner—Vu A. Le
(74) Attorney, Agent, or Firm—Renner, Otto, Boisselle & Sklar, LLP

(57) ABSTRACT

A system for programming a charge stored on a charge storage region of a dielectric charge trapping layer of a first dual bit dielectric memory cell within an array of dual bit dielectric memory cells comprises applying a positive source programming bias to a first bit line that is the source of the selected memory cell while applying a drain programming voltage to a second bit line that forms a drain junction with the channel region and while applying a positive voltage to a selected word line. The source voltage may be applied by coupling the source bit line to a voltage divider or by coupling the source bit line to a resistor which in turn is coupled to a ground. A negative programming bias may also be applied to the substrate and to unselected word lines.

20 Claims, 5 Drawing Sheets

| | Programming Voltage | Read Voltage |
|---|---|---|
| Selected Word Line | Programming Voltage | Read Voltage 94 |
| Unselected Word Line | Negative Bias Voltage | Read Bias Voltage 96 |

| Source Bit Line | 1 Source Programming Bias | 2 Ground | 3 Source Programming Bias | ⎱ 104 |
|---|---|---|---|---|
| Drain Bit Line | Programming Voltage | Programming Voltage | Programming Voltage | |
| Substrate | Ground | Substrate Programming Bias | Substrate Programming Bias | |

101              103              104

|  | 79 | 80 |
|---|---|---|
| Source Bit Line BL(1) | Source | Source |
| Drain Bit Line BL(2) | Drain | Drain |
| BL(3) | Precharge | Float |
| BL(4) | — | Precharge |

SYSTEM FOR PROGRAMMING A NON-VOLATILE MEMORY CELL

TECHNICAL FIELD

The present invention relates generally to flash memory cell devices and more specifically, to improvements in pre-charge systems for reducing short channel current leakage during programming of a dual bit dielectric memory cell structure.

BACKGROUND OF THE PREVENTION

Conventional floating gate flash memory types of EEPROMs (electrically erasable programmable read only memory), utilize a memory cell characterized by a vertical stack of a tunnel oxide ($SiO_2$), a polysilicon floating gate over the tunnel oxide, an interlayer dielectric over the floating gate (typically an oxide, nitride, oxide stack), and a control gate over the interlayer dielectric positioned over a crystalline silicon substrate. Within the substrate are a channel region positioned below the vertical stack and source and drain diffusions on opposing sides of the channel region.

The floating gate flash memory cell is programmed by inducing hot electron injection from the channel region to the floating gate to create a non volatile negative charge on the floating gate. Hot electron injection can be achieved by applying a drain to source bias along with a high control gate positive voltage. The gate voltage inverts the channel while the drain to source bias accelerates electrons towards the drain. The accelerated electrons gain 5.0 to 6.0 eV of kinetic energy which is more than sufficient to cross the 3.2 eV Si—$SiO_2$ energy barrier between the channel region and the tunnel oxide. While the electrons are accelerated towards the drain, those electrons which collide with the crystalline lattice are re-directed towards the Si—$SiO_2$ interface under the influence of the control gate electrical field and gain sufficient energy to cross the barrier.

Once programmed, the negative charge on the floating gate disburses across the semi conductive gate and has the effect of increasing the threshold voltage of the FET characterized by the source region, drain region, channel region, and control gate. During a "read" of the memory cell, the programmed, or non-programmed, state of the memory cell can be detected by detecting the magnitude of the current flowing between the source and drain at a predetermined control gate voltage.

More recently dielectric memory cell structures have been developed. A conventional array of dielectric memory cells 10a–10f is shown in cross section in FIG. 1. Each dielectric memory cell is characterized by a vertical stack of an insulating tunnel layer 18, a charge trapping dielectric layer 22, an insulating top oxide layer 24, and a polysilicon control gate 20 positioned on top of a crystalline silicon substrate 15. Each polysilicon control gate 20 may be a portion of a polysilicon word line extending over all cells 10a–10f such that all of the control gates 20a–20g are electrically coupled.

Within the substrate 15 is a channel region 12 associated with each memory cell 10 that is positioned below the vertical stack. One of a plurality of bit line diffusions 26a–26g separate each channel region 12 from an adjacent channel region 12. The bit line diffusions 26 form the source region and drain region of each cell 10. This particular structure of a silicon channel region 12, tunnel oxide 18, nitride 22, top oxide 24, and polysilicon control gate 20 is often referred to as a SONOS device.

Similar to the floating gate device, the SONOS memory cell 10 is programmed by inducing hot electron injection from the channel region 12 to the charge trapping dielectric layer 22, such as silicon nitride, to create a non volatile negative charge within charge traps existing in the nitride layer 22. Again, hot electron injection can be achieved by applying a drain-to-source bias along with a high positive voltage on the control gate 20. The high voltage on the control gate 20 inverts the channel region 12 while the drain-to-source bias accelerates electrons towards the drain region. The accelerated electrons gain 5.0 to 6.0 eV of kinetic energy which is more than sufficient to cross the 3.2 eV Si—$SiO_2$ energy barrier between the channel region 12 and the tunnel oxide 18. While the electrons are accelerated towards the drain region, those electrons which collide with the crystalline lattice are re-directed towards the Si—$SiO_2$ interface under the influence of the control gate electrical field and have sufficient energy to cross the barrier. Because the nitride layer stores the injected electrons within traps and is otherwise a dielectric, the trapped electrons remain localized within a drain charge storage region that is close to the drain region. For example, a charge can be stored in a drain bit charge storage region 16b of memory cell 10b. The bit line 26b operates as the source region and bit line 26c operates as the drain region. A high voltage may be applied to the channel region 20b and the drain region 26c while the source region 26b is grounded.

Similarly, a source-to-drain bias may be applied along with a high positive voltage on the control gate to inject hot electrons into a source charge storage region that is close to the source region. For example, grounding the drain region 26c in the presence of a high voltage on the gate 20b and the source region 26b may be used to inject electrons into the source bit charge storage region 14b.

As such, the SONOS device can be used to store two bits of data, one in each of the source charge storage region 14 (referred to as the source bit) and the charge storage region 16 (referred to as the drain bit).

Due to the fact that the charge stored in the storage region 14 only increases the threshold voltage in the portion of the channel region 12 beneath the storage region 14 and the charge stored in the storage region 16 only increases the threshold voltage in the portion of the channel region 12 beneath the storage region 16, each of the source bit and the drain bit can be read independently by detecting channel inversion in the region of the channel region 12 between each of the storage region 14 and the storage region 16. To "read" the drain bit, the drain region is grounded while a voltage is applied to the source region and a slightly higher voltage is applied to the gate 20. As such, the portion of the channel region 12 near the source/channel junction will not invert (because the gate 20 voltage with respect to the source region voltage is insufficient to invert the channel) and current flow at the drain/channel junction can be used to detect the change in threshold voltage caused by the programmed state of the drain bit.

Similarly, to "read" the source bit, the source region is grounded while a voltage is applied to the drain region and a slightly higher voltage is applied to the gate 20. As such, the portion of the channel region 12 near the drain/channel junction will not invert and current flow at the source/channel junction can be used to detect the change in threshold voltage caused by the programmed state of the source bit.

In a typical flash memory array, the row and column structure creates problems when programming a selected cell. Each memory cell within a column shares a common source bit line and drain bit line with other memory cells within the column. As such, if other cells within the column leak current between the source bit line and the drain bit line when the drain to source bias is applied, the current leakage will reduce the magnitude of such bias thereby decreasing the programmed charge, can cause an unintended partial programming of unselected cells sharing the same bit lines, and can reduce programming speed, and increase programming current consumption. As memory array applications demand smaller memory cells structures, the short channel effects of the smaller cell structure increases the likelihood of a punch-through phenomena for the non-selected cells thereby exasperating the above described current leakage problems.

What is needed is an improved system for programming a dual bit dielectric memory cell that does not suffer the disadvantages of short channel current leakage.

SUMMARY OF THE INVENTION

A first aspect of the present invention is to provide array of dual bit dielectric memory cells that comprises programming systems that reduce programming current leakage through non-selected memory cells sharing the same column with selected memory cells.

The array comprises: i) a first bit line of a first conductivity semiconductor forming a source region for each of a plurality of memory cells within a column of memory cells within the array; and ii) a second bit line of the first conductivity semiconductor forming a drain region for each of the plurality of memory cells within the column, the second bit line separated from the first bit line by a semiconductor of the opposite conductivity forming a channel region for each of the e plurality of memory cells within the column.

The array further comprises a selected word line positioned over the channel region of a selected one of the plurality of memory cells within the column. The selected word line further forms a gate for each for a plurality of memory cells within a same row of the array as the selected memory cell. Each of a plurality of non-selected word lines, each parallel to the selected word line, form a gate over one of the plurality of non-selected memory cells within the column.

The array further comprises an array control circuit that includes a bit line control circuit, a word line control circuit, and a substrate potential control circuit. During programming of a drain charge trapping region of the selected memory cell, the word line control circuit may apply a positive programming voltage to the selected word line. In conjunction therewith, the bit line control circuit may apply: i) a positive drain voltage to the drain bit line; and ii) a positive source voltage to the source bit line with the positive source voltage being less than the positive drain voltage.

The positive source voltage may be between one tenth of the positive drain voltage and three tenths of the positive drain voltage. Or, to state a more narrow range, the positive source voltage may be between on one tenth of the positive drain voltage and two tenths of the positive drain voltage.

The array may further comprise a resistor coupled between the bit line control circuit and a ground. As such, the bit line control circuit may couple the source bit line to the resistor whereby the positive source voltage is equal to the voltage increase through the resistor.

The word line control circuit may further provide for applying a negative bias voltage to the non-selected word lines in conjunction with the applying a positive programming voltage to the selected word line. The negative bias voltage may be between −0.1 volts and −2.0 volts. Or, to state a more narrow range, the negative bias voltage may be between −0.5 volts and −1.0 volts.

The substrate voltage control circuit may provide for applying a negative substrate voltage to the substrate in conjunction with the word line control circuit applying a positive programming voltage to the selected word line. The negative substrate voltage may be between −0.1 volts and −2.0 volts. Or, to state a more narrow range, the negative substrate voltage may be between −0.5 volts and −1.0 volts.

A second aspect of the invention is to provide a method of programming a charge into a charge storage region of a selected dual bit dielectric memory cell within an array of dual bit dielectric memory cells. The array comprises a plurality of parallel bit lines forming a source and a drain for each cell and a plurality of parallel word lines forming a gate for each cell, the method comprises: i) applying a positive drain voltage to a first bit line that forms a drain junction with the channel region, the first bit line positioned to the right of a channel region; ii) applying a positive source voltage to a second bit line that forms a source junction with the channel region of the selected memory cell in conjunction with applying the positive drain voltage to the first bit line, the positive source voltage being less than the positive drain voltage and the channel region being to the right of the second bit line; and iii) applying a positive program voltage to a selected one of the word lines in conjunction with applying the positive drain voltage to the first bit line, the selected one of the word lines being the word line that forms a gate of the selected memory cell.

The positive source voltage may be between one tenth of the positive drain voltage and three tenths of the positive drain voltage. Or, to state a more narrow range, the positive source voltage may be between on one tenth of the positive drain voltage and two tenths of the positive drain voltage.

The method may further comprise coupling a resistor between the source bit line and ground. As such, the positive source voltage is equal to the voltage increase through the resistor.

The method may further comprise applying a negative bias voltage to the non-selected word lines in conjunction with the word line control circuit applying a positive programming voltage to the selected word line. The negative bias voltage may be between −0.1 volts and −2.0 volts. Or, to state a more narrow range, the negative bias voltage may be between −0.5 volts and −1.0 volts.

The method may further comprise applying a negative substrate voltage to the substrate in conjunction with the word line control circuit applying a positive programming voltage to the selected word line. The negative substrate voltage may be between −0.1 volts and −2.0 volts. Or, to state a more narrow range, the negative substrate voltage may be between −0.5 volts and −1.0 volts.

For a better understanding of the present invention, together with other and further aspects thereof, reference is made to the following description, taken in conjunction with the accompanying drawings. The scope of the invention is set forth in the appended dams.

DESCRIPTION OF THE PREFERRED EMBODIMENTS

The present invention will now be described in detail with reference to the drawings. The diagrams are not drawn to scale and the dimensions of some features are intentionally drawn larger than scale for purposes of showing clarity.

Figure 1:
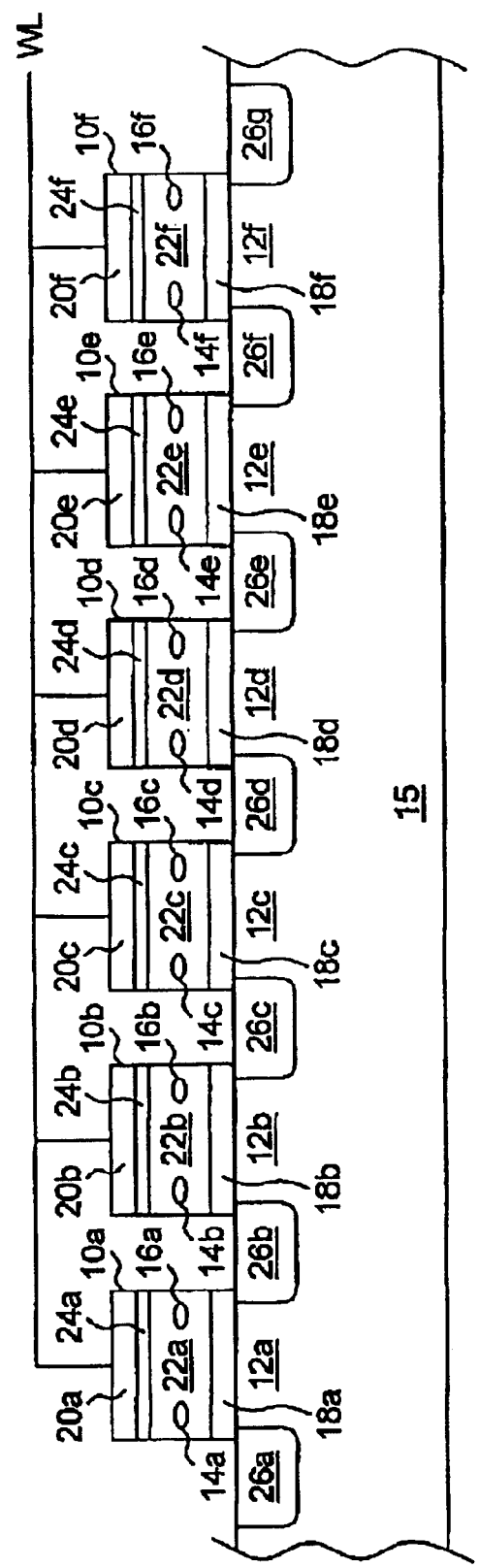
FIG. 1 is a schematic, cross sectional view of a dielectric memory cell array known in the prior art.
Figure 2:
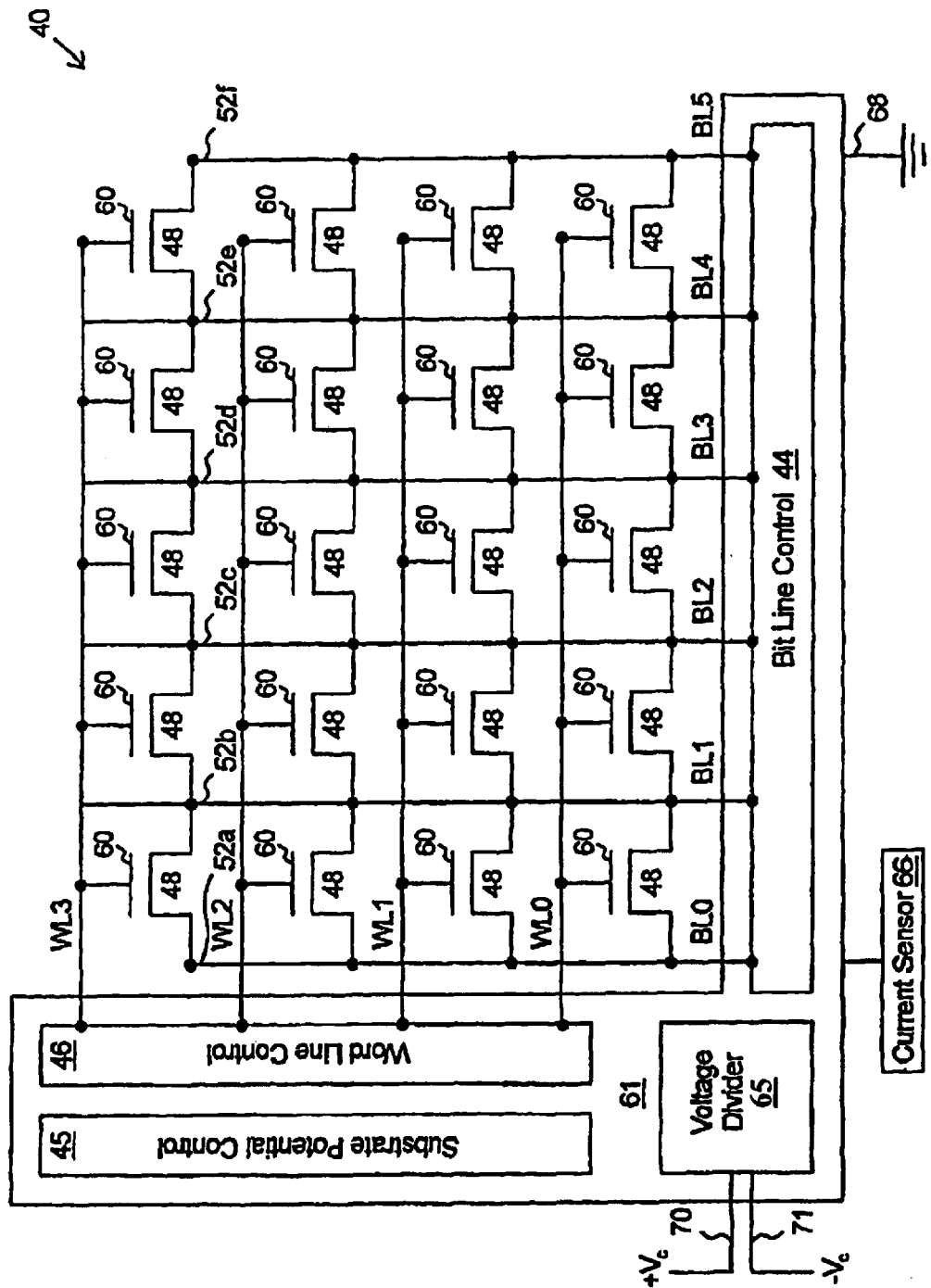
FIG. 2 is a schematic, block diagram view of a dielectric memory cell array in accordance with one embodiment of the present invention.

FIG. 2 shows an exemplary embodiment of a dual bit dielectric memory cell array 40 in block diagram form. The array 40 comprises a plurality of dual bit dielectric memory cells 48, an array control circuit 61, and a current sense circuit 66 fabricated on a crystalline semiconductor substrate. The array of dual bit dielectric memory cells 48 is arranged in a matrix format with horizontal rows of polysilicon word lines WL(0)–WL(3) and vertical columns of alternating bit line diffusions BL(0)–BL(5) and channel regions 50 within the substrate 42. Each cell 48 within a column shares the same two bit lines that are adjacent to, and form a junction with, each cell's channel region. Each cell 48 within a row shares the same word line WL(0)–WL(3) with other cells 48 in the row.

Figure 3:
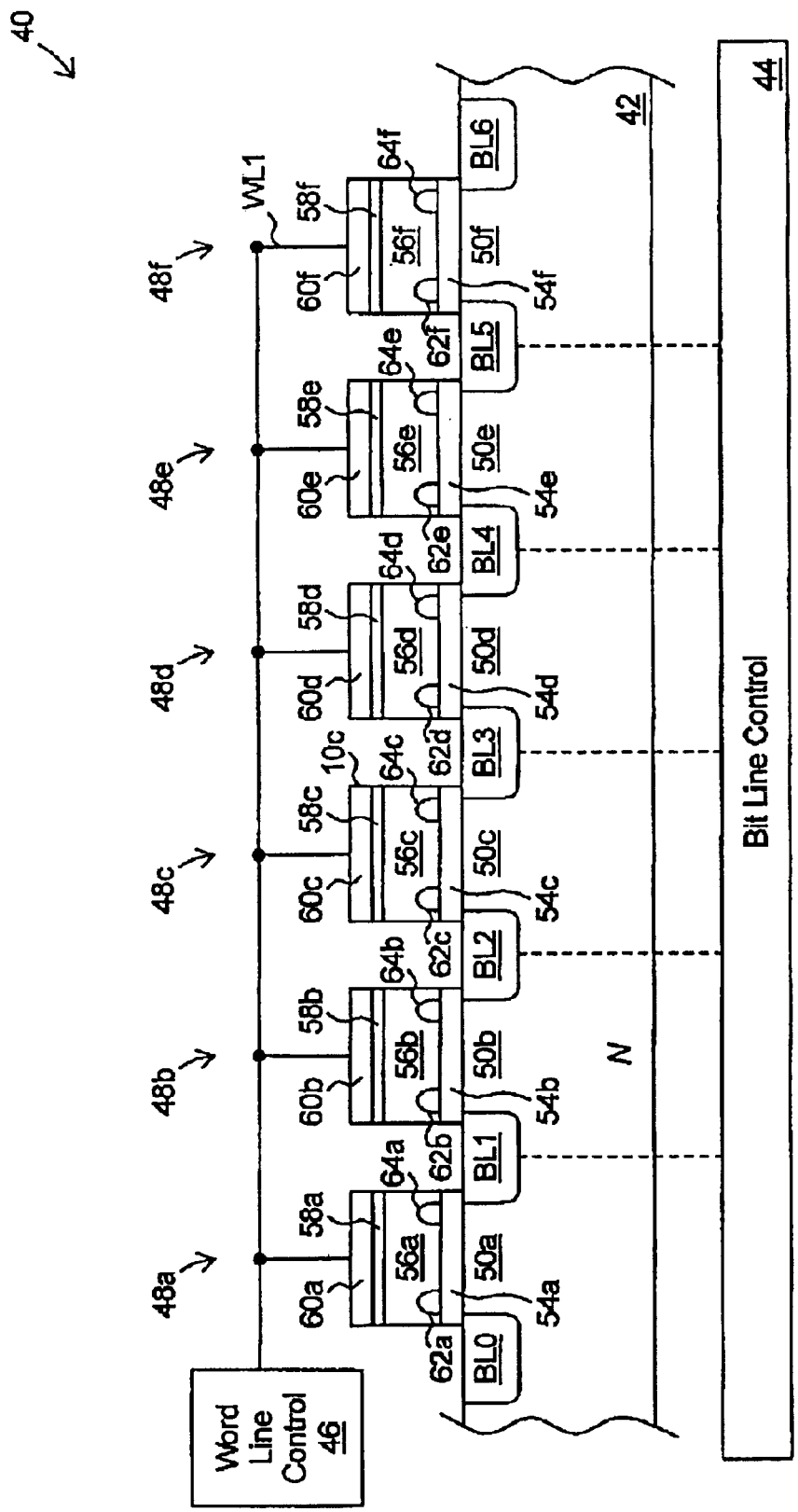
FIG. 3 is a schematic, cross sectional view of the dielectric memory cell array of FIG. 2.

Reference is now made to the cross section diagram representing a row of dual bit dielectric memory cells which share a common word line, WL(1), as shown in FIG. 3 in conjunction with the FIG. 2. It should be appreciated that the polysilicon word line WL(1) is structured to form a control gate 60 over each cell 48 in the row. The bit line diffusions BL(0)–BL(6) are of opposite semiconductor conductivity as the channel regions 50 such that the bit line diffusions BL(0)–BL(6) form a source region and a drain region for each cell in the column. In the exemplary n-mos device, the channel region 50 is a p-type semiconductor such as crystalline silicon lightly implanted with a hole donor impurity such boron and the bit line diffusions BL(0)–BL(6) are an n-type semiconductor such as crystalline silicon implanted with an electron donor impurity such as arsenic.

Above the channel region 50 is a first insulating barrier or tunnel layer 54 which may comprise silicon dioxide. The thickness of the tunnel layer 54 may be within a range of about 50 to about 150 angstroms. An embodiment with a more narrow bracket includes a tunnel layer 54 thickness within a range of about 60 to about 90 angstroms and even narrower yet, a tunnel layer 54 with a thickness of about 70 to about 80 angstroms.

Above the tunnel layer is a charge trapping layer 56 that includes both a source charge trapping region or source bit 62 and a drain charge trapping region or drain bit 64 each for storing a neutral charge representing an unprogrammed state or a negative charge representing a programmed state. The charge trapping layer 56 may comprise a nitride compound with suitable charge trapping properties and may have a thickness on the order of 20 to 100 angstroms. In the exemplary embodiment, the nitride compound may be selected from the group consisting of $Si_2N_4$, $Si_3N_4$ and $SiO_xN_4$.

Above the charge trapping layer 56 is a top dielectric layer 58. The top dielectric layer 58 may be silicon dioxide or may be a material with a dielectric constant greater than the dielectric constant of silicon dioxide (e.g. a high K material). In a preferred embodiment, the high K material may be selected from the group of materials consisting of $Al_2O_3$, $HfSi_xO_y$, $HfO_2$, $ZrO_2$, and $ZrSi_xO_y$ and other materials with similarly high dielectric constants. If the top dielectric layer 58 is silicon dioxide, the layer 58 may have a thickness on the order of 60 to 100 angstroms. Alternatively, if the top dielectric layer 58 is a high K material, its electrical thickness may be on the order of 60 to 100 angstroms while its physical thickness may be within a range of about 70 to 130 angstroms. An embodiment with a more narrow bracket includes a top dielectric layer 58 with a thickness within a range of about 80 to about 120 angstroms and even narrower yet, a top dielectric layer 58 with a thickness of about 90 to about 100 angstroms.

Above the top dielectric layer 58 is the word-line WL(1) forming the gate 60 over each cell 48a–48f. In the exemplary embodiment, the gate 60 may comprise polysilicon with a thickness on the order of 4,000 angstroms. The word-line WL(1) is coupled to the word line control circuit 46.

The array control circuit 61 comprises a word line control circuit 46, a bit line control circuit 44, a substrate potential control circuit 45, a voltage divider circuit 65, a coupling to a positive operating power source (Vc) 70, a coupling to a negative operating power source (−Vc) 71, and a coupling to a ground 68. In operation, the array control circuit operates to selectively couple each word line WL(0)–WL(3), each bit line BL(0)–BL(6), and the substrate 42 to a voltage provided by the voltage divider 65 or to ground (or to isolate the word line WL(0)–WL(3) or bit line BL(0)–BL(6) from all voltage sources and ground such that is potential is effected only by electrical interaction with other structure of the array 40). The coupling is in such a manner that each source charge trapping region 62 and each drain charge trapping region 64 within the array 40 can be erased, selectively programmed, and selectively read. The array control circuit also operates to couple a selected bit line to the current sensor 66 such that a current on the selected bit line may be measured to indicate the programmed state of a selected source charge trapping region 62 or drain charge trapping region 64 of a cell within a column of cells in which such selected bit line is either a source or a drain.

The current sensor 66 may utilize known circuits for sensing current on the selected bit line that is coupled to the current sensor 66 by the bit line control circuit 44. The current sensed represents the programmed state of a selected one of a source charge trapping region 62 or a drain charge trapping region 64 when applicable potentials are coupled to applicable word lines and bit lines by the array control circuit 61 for reading the selected charge trapping region as described in more detail herein.

Array Control Circuit

Figures 4, 5:
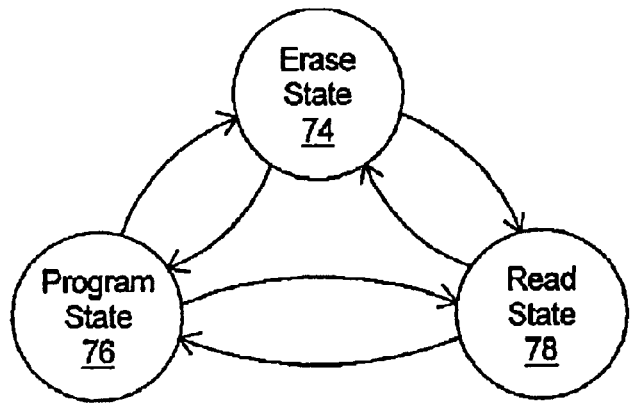
FIG. 4 is a state machine diagram representing exemplary operation of an array control circuit.
FIG. 5 is a table representing an exemplary operating embodiment of a word line control circuit in accordance with this invention.

Turning briefly to FIG. 4 in conjunction with FIG. 2 and FIG. 3, the array control circuit 61 operates in three states, a program state 76 where in charge is selectively stored into the source charge trapping region 62 or the drain charge trapping region 64 of a selected one of the memory cells 48, a read state 78 wherein a stored charge is detected from the source charge trapping region 62 or the drain charge trapping region 62 of a selected one of the memory cells 48 to reproduce data originally stored in such charge trapping region, and an erase state 78 wherein charge stored in charge trapping regions 62 and 64 of one or more memory cells 48 is removed prior to reprogramming in the program state 76.

Programming State

When in the program state 76, the drain charge trapping region 64 is programmed by injecting electrons into the drain charge trapping region 64 using a hot electron injection technique. More specifically, the array control circuit 61 couples bit lines BL(0)–BL(6), word lines WL(0)–WL(3). and the substrate 42 to various potentials (e.g provided by the voltage divider 65 and ground 68) to apply a high drain-to-source bias while applying a high voltage to the control gate 60. For example, referring to cell 48b, this may be accomplished by the bit line control circuit 44 coupling the bit line BL(1), which represents the source region of cell 48b, to ground 68 and the bit line control circuit 44 coupling the bit line BL(2), which represents the drain region of cell 48b, to a programming voltage from the voltage divider 65 of approximately 5 volts.

Simultaneously, the word line control circuit 46, which operates in accordance with the table of FIG. 5, couples the selected word line WL(1), representing the control gate 60, to a selected word line programming voltage from the voltage divider 65 of approximately 10 volts and may couple non-selected word lines (e.g. the word lines other than the selected word line WL(1) to a small negative bias voltage to prevent punch-through current leakage through non-selected memory cells that share the same column as the selected memory cell 48b. The voltage on the control gate 60 inverts the channel region 50b while the high drain-to-source bias draws and accelerates electrons from the source region BL(1) into the channel region 50b towards the drain region BL(2).

The 4.5 eV to 5 eV kinetic energy gain of the electrons is more than sufficient to surmount the 3.1 eV to 3.5 eV energy barrier at channel region 52b/tunnel layer 54b interface and, while the electrons are accelerated towards drain region 52c, the field caused by the high voltage on control gate 60b redirects the electrons towards the drain charge trapping region 64b. Those electrons that cross the interface into the drain trapping region 64b remain trapped within the charge trapping layer 56b for later reading.

Similarly, the source charge trapping region 62 is programmed by injecting electrons into the source charge trapping region 62. More specifically, the array control circuit 62 couples bit lines BL(0)–BL(6), word lines WL(0) –WL(3), and the substrate 42 to various potentials (e.g provided by the voltage divider 65 and ground 68) to apply a high source-to-drain bias while applying a high voltage to the control gate 60. For example, referring to cell 48b, this may be accomplished by the bit line control circuit 44 coupling the bit line BL(2), which represents the drain region of cell 48b, to ground 68 and coupling the bit line BL(1), which represents the source region of cell 48b, to a programming voltage from the voltage divider 65 of approximately 5 volts. Simultaneously, word line control circuit 46 couples the selected word line WL(1), representing the control gate 60, to a selected word line programming voltage form the voltage divider 65 of approximately 10 volts and may couple non-selected word lines (e.g. the word lines other than the selected word line WL(1) to a small negative bias voltage to prevent punch-through current leakage through non-selected memory cells that share the same column as the selected memory cell 48b. The voltage on the control gate 60 inverts the channel region 50b while the high source-to-drain bias draws and accelerates electrons from the drain region BL(2) into the channel region 50b towards the source region BL(1).

Again, the 4.5 eV to 5 eV kinetic energy gain of the electrons is more than sufficient to surmount the 3.1 eV to 3.5 eV energy barrier at channel region 50b/tunnel layer 54b interface and, while the electrons are accelerated towards source region BL(1), the field caused by the high voltage on control gate 60b redirects the electrons towards the source charge trapping region 62b.

As discussed, if other non-selected cells within the column (e.g. cells that share the same bit lines BL(1) and BL(2) leak current during programming, the current leakage can reduce the magnitude of the programming bias, decrease the accuracy of the magnitude of the programming bias, cause unintended partial programming of the non-selected cells, reduce programming speed, and increase programming current.

Figures 6, 7, 8:
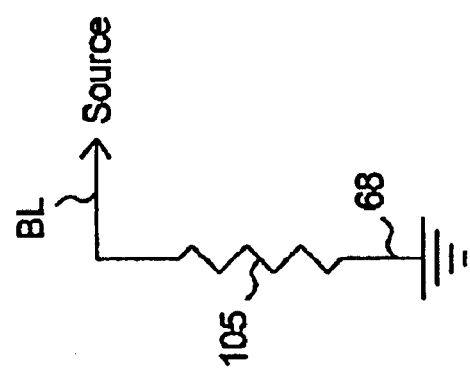
FIG. 6 is a table representing exemplary operating embodiments of an array control circuit for programming the dielectric memory cell array in accordance with this invention.
FIG. 7 is a circuit diagram representing a circuit for implementing a source region positive potential programming bias in accordance with one embodiment of this invention.
FIG. 8 is a table representing exemplary operating embodiments of an array control circuit for reading the dielectric memory cell array in accordance with this invention.

Referring to FIG. 6, three embodiments of programming systems are represented. Each embodiment provides for reduction in current leakage through non-selected cells that share a column with the selected cell. Although the table of FIG. 6 represents the three embodiments for programming a drain charge storage region 64 (FIG. 3), it should be appreciated that the same systems may be utilized for programming a source charge storage region 62 by interchanging the references to the source bit lines and the drain bit lines.

The first embodiment 101 represents applying a small positive source programming bias to the source bit line during programming. More specifically, referring again to cell 48(b), the bit line control circuit 44 couples the bit line BL(1), which represents the source region of cell 48b, to a small positive source programming bias from the voltage divider and couples the drain region of cell 48b, to a programming voltage from the voltage divider 65 of approximately 5 volts. The substrate 42 is grounded. Simultaneously, the word line control circuit 46 couples the selected word line WL(1), representing the control gate 60, to a selected word line programming voltage from the voltage divider 65 of approximately 10 volts and may couple non-selected word lines (e.g. the word lines other than the selected word line WL(1) to a small negative bias voltage.

The small positive source programming bias is less than the programming voltage coupled to the drain region. More specifically, the positive source programming voltage may be between one tenth of the programming voltage applied to the drain region and two tenths of the programming voltage applied to the drain region.

Referring briefly to FIG. 7 in conjunction with FIG. 2, as an alternative to the bit line control circuit 44 coupling the source region to a small positive programming bias from the voltage divider 65, the bit line control circuit 44 may include a resistor 105 which couples between ground 68 and the bit line representing the source region. As such, the resistor operates as a voltage divider as the programming current flows between the source region and ground with the positive potential of the source region being equal to the voltage crop across the resistor 105.

Returning to FIG. 6 in conjunction with FIGS. 2 and 3, the second embodiment represents the substrate control circuit 45 applying a small substrate programming bias to the substrate 42 during programming. More specifically, referring again to cell 48(b), the bit line control circuit 44 couples the bit line BL(1), which represents the source region of cell 48b, to ground and couples the drain region of cell 48b, to a programming voltage from the voltage divider 65 of approximately 5 volts. At the same time, the substrate control circuit 45 couples the substrate 42 to the small substrate programming bias. The word line control circuit 46 couples the selected word line WL(1), representing the control gate 60, to a selected word line programming voltage from the voltage divider 65 of approximately 10 volts and may couple non-selected word lines (e.g. the word lines other than the selected word line WL(1) to a small negative bias voltage.

The small substrate programming bias may be a negative voltage between −0.1 volts and −2.0 volts. For a more narrow range, the small substrate programming bias may be between −0.5 volts and −1.0 volts.

The third embodiment represents combining both the first embodiment and the second embodiment such that: a) the substrate control circuit 45 applies a small substrate programming bias to the substrate 42 during programming and the bit line control circuit 44 couples the bit line BL(1), which represents the source region of cell 48b, to a small positive source programming bias from the voltage divider during programming. Both the substrate programming bias and the small positive source programming bias may be within the ranges discussed with respect to the first embodiment and the second embodiment. Further, the circuit of FIG. 7 may be utilized to apply the positive source programming bias.

Erase State

When in the erase state 74, the array control circuit may couple applicable bit lines BL(0)–BL(6) and word lines 72 to applicable potentials such that the source charge trapping region 62 and the drain charge trapping region 64 of multiple cells are erased using either a hot hole injection technique or by tunneling the electrons from the charge trapping layer 56 to the gate 60 or to the substrate. Both techniques are known in the art.

Read State

When in the read state 78, the presence of trapped electrons (e.g a negative charge representing a programmed state) in a selected source charge trapping region 62 or drain charge trapping region 64 is detected. It is recognized that the presence of trapped electrons within a source charge trapping region 62 or a drain charge trapping region 64 effect accumulation within the channel region 50 below such charge trapping regions. As such, the presence of trapped electrons in either the source charge trapping region 62 or the drain charge trapping region 64 effect the threshold voltage of a field effect transistor (FET) characterized by the control gate 60, a bit line diffusion BL(0)–BL(6) that functions as a source region, and a bit line diffusion BL(0)–BL(6) that functions as a drain region. Therefore, each bit of the dual bit memory cell 48 may be "read", or more specifically, the presence of electrons stored within each of the source charge trapping region 62 and the drain charge trapping region 64 may be detected by operation of the FET.

In particular, the presence of electrons stored within a source charge trapping region 62 may be detected by applying a positive voltage to the control gate 60 and a lesser positive voltage to the bit line that functions as the drain region while the bit line that functions as the source region is grounded. The current flow is then measured at the bit line that functions as either the source region or the drain region. Assuming proper voltages and thresholds for measurement (and assuming no current leakage from adjacent memory cells 48 within the same row as the selected cell 48 and assuming no current leakage from memory cells 48 within the same column as the selected cell 48) if there are electrons trapped within the source charge trapping region 62, no measurable current will be measured at the bit line comprising the drain region. Otherwise, if the source charge trapping region 62 is charge neutral (e.g., no trapped electrons) then there will be a measurable current flow into the bit line functioning as the drain region. Similarly, the presence of electrons stored within the drain charge trapping region 64 may be detected by the same method, and merely reversing the bit line functioning as the source region and the bit line functioning as the drain region.

Recognizing that current leakage from non-selected memory cells that share the same column as the selected memory cell may effect accurate reading, the array control circuit 61 may apply bias voltages to non-selected word lines and/or the bit line forming the source region of the column to prevent such leakage.

The table of FIG. 5 represents exemplary operation of the word line control circuit 46 for applying bias voltages for reading a selected memory in accordance with the present invention. Referring to FIG. 5 in conjunction with FIG. 3, when reading the source charge trapping region of a selected memory cell, the word line control circuit 46 will couple the selected word line 90 to a positive read voltage 94, on the order of 10 volts, from the voltage divider 65 and couple the non-selected word lines (e.g. all word lines other than the selected word line) to a read bias voltage 96 from the voltage divider 65 in order to prevent punch through current leakage through the memory cells that share the same column as the selected memory cell. The read bias voltage 96 may be a negative voltage. More specifically, the read bias voltage 96 may be a negative voltage between −0.1 volt and −2.0 volt, or for a more narrow range, between −0.1 volt and −0.5 volt; or for a more narrow range yet, between −0.1 volt and −0.2 volt.

The table of FIG. 8 represents exemplary operation of the bit line control circuit 44 for applying voltages to the bit lines for reading a selected memory cell in accordance with the present invention. Referring to embodiment 79 of FIG. 8 in conjunction with FIG. 2, when reading the source charge trapping region of a selected memory cell, for example cell 48b, the bit line control circuit 44 will couple the bit line BL(1) that represents the source region of cell 48b to a source voltage from the voltage divider 65 and will couple the bit line BL(2) that represents the drain region of cell 48b to both a positive drain voltage from the voltage divider 65 and to the current sensor circuit 66. The drain voltage may be less than or equal to the read voltage 94 applied to the selected word line 90. The source voltage may be ground or may be a small positive voltage between 0.0 volts and 1.0 volts in order to reduce punch-through current leakage through non-selected memory cells 48 that share the same column with the selected cell 48b.

Recognizing that current leakage from adjacent memory cells in the same row as the selected cell may affect accurate reading, the bit line control circuit 44 may recharged the next bit line to the right of the drain bit line, referred to as BL(3), with a small positive voltage to prevent such leakage.

Alternatively, referring to embodiment 80 of FIG. 8, the bit line control circuit 44 may isolate BL(3) such that its potential may float while being effected only by its junctions with each of the channel regions 50 on opposing sides of the bit line (e.g channel regions 50c and 50d in the example of reading source bit 62b); and may couple the next bit line to the right of BL(3), referred to as BL(4), to a pre-charge voltage from the voltage divider circuit 65 such that it is neutral biased to the control gate 60 and positive biased with respect to the source bit line BL(1). Various other combinations of floating bit lines and pre-charging bit lines are envisioned to reduce current leakage through memory cells that share the same row with the selected memory cell.

In summary, the method for programming a charge trapping region of a dual bit dielectric memory cell of this invention provides for more faster and more accurate programming utilizing less programming current due to reduced leakage through other memory cells sharing the same column as the selected memory cell. Although this invention has been shown and described with respect to certain preferred embodiments, it is obvious that equivalents and modifications will occur to others skilled in the art upon the reading and understanding of the specification. For example, Although the cells of the array are shown as a substantially planar structure formed on the silicon substrate, it should be appreciated that the teachings of this invention may be applied to both planar, fin formed, and other dielectric memory cell structures which may be formed on suitable semiconductor substrates which include, for example, bulk silicon semiconductor substrates, silicon-on-insulator (SOI) semiconductor substrates, silicon-on-sapphire (SOS) semiconductor substrates, and semiconductor substrates formed of other materials known in the art. The present invention includes all such equivalents and modifications, and is limited only by the scope of the following claims.

What is claimed is:

1. An array of dual bit dielectric memory cells, the array comprising:
   a first bit line of a first conductivity semiconductor forming a source region for each of a plurality of memory cells within a column of memory cells within the array;
   a second bit line of the first conductivity semiconductor forming a drain region for each of the plurality of memory cells within the column, the second bit line separated from the first bit line by a semiconductor of the opposite conductivity forming a channel region for each of the plurality of memory cells within the column;
   a selected word line positioned over the channel region of a selected one of the plurality of memory cells within the column and further forming a gate for each for a plurality of memory cells within a same row of the array as the selected memory cell;
   a plurality of non-selected word lines, each parallel to the selected word line and each forming a gate over one of the plurality of memory cells within the column other than the selected one of the plurality of memory cells;
   a word line control circuit for:
      applying a positive programming voltage to the selected word line;
   a bit line control circuit for applying, in conjunction with the word line control circuit applying the positive programming voltage to the selected word line:
      a positive drain voltage to the drain bit line; and
      a positive source voltage to the source bit line, the positive source voltage being less than the positive drain voltage.

2. The array of dual bit dielectric memory cells of claim 1, further comprising:
   a resistor coupled between the bit line control circuit and a ground; and
   wherein the bit line control circuit couples the source bit line to the resistor and the positive source voltage thereby equal to the voltage increase through the resistor.

3. The array of dual bit dielectric memory cells of claim 1, wherein the word line control circuit further provides for:
   applying a negative bias voltage to the non-selected word lines in conjunction with the word line control circuit applying a positive programming voltage to the selected word line.

4. The array of dual bit dielectric memory cells of claim 3, wherein the negative bias voltage is between −0.1 volts and −2.0 volts.

5. The array of dual bit dielectric memory cells of claim 4, wherein the negative bias voltage is between −0.5 volts and −1.0 volts.

6. The array of dual bit dielectric memory cells of claim 1, further comprising a substrate voltage control circuit for applying a negative substrate voltage to the substrate in conjunction with the word line control circuit applying a positive programming voltage to the selected word line.

7. The array of dual bit dielectric memory cells of claim 6, wherein the negative substrate voltage is between −0.1 volts and −2.0 volts.

8. The array of dual bit dielectric memory cells of claim 7, wherein the negative substrate voltage is between −0.5 volts and −1.0 volts.

9. The array of dual bit dielectric memory cells of claim 1, wherein the positive source voltage is between one fiftieth of the positive drain voltage and three tenths of the positive drain voltage.

10. The array of dual bit dielectric memory cells of claim 9, wherein the positive source voltage is between on one fiftieth of the positive drain voltage and two tenths of the positive drain voltage.

11. A method of programming a charge into a charge storage region of a selected dual bit dielectric memory cell within an array of dual bit dielectric memory cells, the array comprising a plurality of parallel bit lines forming a source and a drain for each cell and a plurality of parallel word lines forming a gate for each cell, the method comprising:
   applying a positive drain voltage to a first bit line that forms a drain junction with the channel region, the first bit line positioned to the right of a channel region;
   applying a positive source voltage to a second bit line that forms a source junction with the channel region of the selected memory cell in conjunction with applying the positive drain voltage to the first bit line, the positive source voltage being less than the positive drain voltage, the channel region being to the right of the second bit line;
   applying a positive program voltage to a selected one of the word lines in conjunction with applying the positive drain voltage to the first bit line, the selected one of the word lines being the word line that forms a gate of the selected memory cell.

12. The method of claim 11, further comprising:
   coupling a resistor between the source bit line and ground and the positive source voltage thereby equal to the voltage increase through the resistor.

13. The method of claim 11, further comprising:
   applying a negative bias voltage to the non-selected word lines in conjunction with the word line control circuit applying a positive programming voltage to the selected word line.

14. The method of claim 13, wherein the negative bias voltage is between −0.1 volts and −2.0 volts.

15. The method of claim 14, wherein the negative bias voltage is between −0.5 volts and −1.0 volts.

16. The method of claim 11, further comprising:

applying a negative substrate voltage to the substrate in conjunction with the word line control circuit applying a positive programming voltage to the selected word line.

17. The method of claim 16, wherein the negative substrate voltage is between −0.1 volts and −2.0 volts.

18. The method of claim 17, wherein the negative substrate voltage is between −0.5 volts and −1.0 volts.

19. The method of claim 11, wherein the positive source voltage is between one fiftieth of the positive drain voltage and three tenths of the positive drain voltage.

20. The method of claim 19, wherein the positive source voltage is between on one fiftieth of the positive drain voltage and two tenths of the positive drain voltage.

* * * * *

UNITED STATES PATENT AND TRADEMARK OFFICE
CERTIFICATE OF CORRECTION

PATENT NO. : 6,795,342 B1
DATED : September 21, 2004
INVENTOR(S) : He et al.

It is certified that error appears in the above-identified patent and that said Letters Patent is hereby corrected as shown below:

Column 1,
Line 12, replace "Prevention" with -- Invention --

Column 4,
Line 60, replace "dams" with -- claims --

Signed and Sealed this

Seventh Day of December, 2004

JON W. DUDAS
*Director of the United States Patent and Trademark Office*